(12) United States Patent
Raghunathan et al.

(10) Patent No.: US 9,753,892 B2
(45) Date of Patent: *Sep. 5, 2017

(54) METHOD FOR SOLVING QUADRATIC PROGRAMS FOR CONVEX SETS WITH LINEAR EQUALITIES BY AN ALTERNATING DIRECTION METHOD OF MULTIPLIERS WITH OPTIMIZED STEP SIZES

(71) Applicant: Mitsubishi Electric Research Laboratories, Inc., Cambridge, MA (US)

(72) Inventors: Arvind U Raghunathan, Brookline, MA (US); Stefano Di Cairano, Somerville, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 862 days.

This patent is subject to a terminal disclaimer.

(21) Appl. No.: 14/185,024

(22) Filed: Feb. 20, 2014

(65) Prior Publication Data

US 2015/0234779 A1   Aug. 20, 2015

(51) Int. Cl.
*G06F 7/60* (2006.01)
*G06F 17/10* (2006.01)
(Continued)

(52) U.S. Cl.
CPC ............ *G06F 17/11* (2013.01); *G05B 13/026* (2013.01); *G06F 17/50* (2013.01)

(58) Field of Classification Search
None
See application file for complete search history.

(56) References Cited

U.S. PATENT DOCUMENTS 7,328,074 B2   2/2008   Das et al.
8,600,525 B1   12/2013  Mustafa et al.
(Continued)

OTHER PUBLICATIONS

Yang, Sen et al., "An Efficient ADMM Algorithm for Multidimensional Anisotropic Total Variation Regularization Problems", Aug. 11-14, 2013, KDD'13, ACM.*
(Continued)

*Primary Examiner* — Cedric D Johnson
(74) *Attorney, Agent, or Firm* — Gene Vinokur; James McAleenan; Hironori Tsukamoto

(57) ABSTRACT

A method solves a convex quadratic program (QP) for a convex set. Constrains of the QP include sets of linear equalities and linear inequalities. The solving uses an Alternating Direction Method of Multipliers (ADMM). Variables of the convex QP include a linear subspace constrained variable vector and a set constrained variable vector. The method solves the linear subspace constrained variable vector while keeping the set constrained variable vector fixed using an optimal step size and a Lagrangian multiplier, and solves the set of constrained variable vector while keeping linear subspace constrained variable vector fixed using the optimal step size and the Lagrangian multiplier. Then, the Lagrangian multiplier is updated. A feasible solution is outputted if a termination condition for the feasible solution is satisfied, and an infeasible solution is signaled if a termination condition for the satisfied for the infeasible solution is satisfied. Otherwise, the steps are repeated.

14 Claims, 7 Drawing Sheets

(51) Int. Cl.
*G06F 17/11* (2006.01)
*G05B 13/02* (2006.01)
*G06F 17/50* (2006.01)

(56) References Cited

U.S. PATENT DOCUMENTS

| | | |
|---|---|---|
| 2006/0282177 A1 | 12/2006 | Fuller et al. |
| 2012/0281929 A1 | 11/2012 | Brand et al. |
| 2013/0018517 A1* | 1/2013 | Kalagnanam .......... G06Q 50/06 700/291 |
| 2014/0089759 A1* | 3/2014 | Draper .................. H04L 1/0045 714/766 |

OTHER PUBLICATIONS

Boyd, Stephen et al., "Distributed Optimization and Statistical Learning via the Alternating Direction Method of Multipliers", 2011, Foundations and Trends in Machine Learning.*

Shanno, David F. et al., "Numerical Experience with Sequential Quadratic Programming Algorithms for Equality Constrained Nonlinear Programming" Mar. 1989, ACM Transactions on Mathematical Software, vol. 15, No. 1, ACM.*

S. Boyd, N. Parikh, E. Chu, and J. Eckstein, "Distributed optimization and statistical learning via the alternating direction method of multipliers," Foundations and Trends in Machine Learning, vol. 3, No. 1, p. 1-122, 2011.

C. Garcia, D. Prett, and M. Morari, "Model predictive control: theory and practice—a survey," Automatica(Oxford), vol. 25, No. 3, pp. 335-348, 1989.

Kögel et al., "Fast predictive control of linear systems combining Nesterovs gradient method and the method of multipliers," Proc. 51st IEEE Conf. on Dec. and Control, Orlando, FL, 2011, pp. 501-506.

B. O'Donoghue, G. Stathopoulos, and S. Boyd, "A splitting method for optimal control," IEEE Trans. Control Systems Technology (to appear), 2013.

R. T. Rockafellar, "Monotone operators and the proximal point algorithm," SIAM J. Control Opt., vol. 14, pp. 877-898, 1976.

Kögel et al., "Fast predictive control of linear, time-invariant systems using an algorithm based on the fast gradient method and augmented Lagrange multipliers," CCA 2011: 780-785, 2011.

Richter et al "Computational Complexity Certification for Real-Time MPC With Input Constraints Based on the Fast Gradient Method," IEEE Trans. Automat. Contr. 57(6): 1391-1403 (2012).

Ghadimi et al. "Optimal Parameter Selection for the alternating direction method of multipliers (ADMM): Quadratic Problems," ArXiv: 1306.2454v1 [math.OC], Jun. 11, 2013, pp. 1-33.

Boyd et al. "Distributed Optimization and Statistical Learning via the Alternating Direction Method of Multipliers," Foundations and Trends in Machine Learning, vol. 3, No. 1, 2010, pp. 1-122.

O'Donoghue et al. "A Splitting Method for Optimal Control," IEEE Transactions on Control Systems Technology. vol. 21, No. 6. Nov. 2013. pp. 2432-2442. sections I-III.

Raghunathan et al. "Alternating Direction Method of Multipliers for Strictly Convex Quadratic Programs: Optimal Parameter Selection," 2014 American Control Conference (ACC 2014). Jun. 4-6, 2014, Portland OR. Jun. 4, 2014. pp. 4324-4329.

Raghunathan et al. "Optimal Step-Size Selection in Alternating Direction Method of Multipliers for Convex Quadratic Programs and Model Predictive Control," The 21st International Symposium on Mathematical Theory of Networks and Systems (MTNS 2014), Jul. 7-11, 2014. pp. 807-814.

Raghunathan et al. "Infeasibility Detection in Alternating Direction Method of Multipliers for Convex Quadratic Programs," 53rd IEEE Conference on Decision and Control (CDC 2014), Dec. 15-17, 2014. pp. 5819-5824.

Raghunathan et al. "ADMM for Convex Quadratic Programs: Linear Convergence and Infeasibility Detection," Jan. 9, 2015, retrieved from the Internet: http://arxiv.org/abs/1411.7288.

* cited by examiner

METHOD FOR SOLVING QUADRATIC PROGRAMS FOR CONVEX SETS WITH LINEAR EQUALITIES BY AN ALTERNATING DIRECTION METHOD OF MULTIPLIERS WITH OPTIMIZED STEP SIZES

FIELD OF THE INVENTION

The invention relates generally to solving a convex quadratic program (QP) for a convex set with linear equalities, and more particularly to solving the convex QP by an Alternating Direction Method of Multipliers (ADMM).

BACKGROUND OF THE INVENTION

The Alternating Direction Method of Multipliers (ADMM), which is a variant of an augmented Lagrangian scheme, uses partial updates for dual variables to solve a problem. The ADMM technique" alternately solves for a first variable while holding a second fixed, and solving for the second variable while holding the first variable fixed, see Boyd et al. "Distributed optimization and statistical learning via the alternating direction method of multipliers," Foundations and Trends in Machine Learning, vol. 3, no. 1, p. 1-122, 2011. Rather than iterating until convergence as in the Lagrangian-augmented problem, which is possibly complex, the ADMM performs iterations of alternating steps of updates on subsets of the variables.

The ADMM is frequently used for solving structured convex quadratic programs (QP) in applications, such as for example, compressive sensing, image processing, machine learning, distributed optimization, regularized estimation, and semi-definite programming, to name but a few.

Of particular interest to the invention is the potential application of ADMM to model predictive control (MPC) problems. MPC is a method for solving constrained dynamical systems by repeatedly solving a finite horizon optimal control formulated from system dynamics, constraints, and a user specified cost function.

For linear systems subject to linear constraints and with a quadratic cost function, the MPC finite horizon optimal control problem can be formulated as a parametric QP. At every control cycle, a specific QP is generated from the parametric quadratic program and the current values of the system state, and possibly the current reference. Then, the QP is solved, and the first part of the control input sequence is applied as control input. At the following control cycle, a new optimization problem is solved from the updated system state. MPC has been increasingly applied to systems with fast dynamics where the MPC is implemented in a low computational power embedded processors.

There are many prior art methods for determining a minimizer of the QP while satisfying linear equalities and the convex set. For example, active set methods and interior point methods are the most common iterative methods.

U.S. Pat. No. 8,600,525 discloses an active set algorithm that can be used for solving MPC generated QP problems. U.S. Pat. No. 7,328,074 further discloses a method of providing an active-set algorithm wherein an initial guess for an optimization problem is provided from the solution of a previous optimization. U.S. Publication 20060282177 discloses an interior point algorithm for solving the quadratic programs that arise in the context of model predictive control of gas turbine engines.

However, the computational effort per iteration of those methods can be prohibitive for application to large scale problems. The complexity of the operations that are performed, such as the solution of large scale linear systems, makes them infeasible for the type of computing hardware commonly used in real-time control and signal processing applications.

On the other hand, methods such as gradient methods and accelerated gradient methods cannot easily handle linear inequality constraints. Low complexity fast optimization methods have been developed for MPC.

U.S. Publication 20120281929 discloses a method for solving quadratic programs with non-negative constraints and a method to optimize such method for application to MPC.

A fast gradient algorithm is described for an application to MPC by Richter et al. "Computational Complexity Certification for Real-Time MPC With Input Constraints Based on the Fast Gradient Method," IEEE Trans. Automat. Contr. 57(6): 1391-1403 (2012).

A Lagrangian method for MPC is described by Kögel et al., "Fast predictive control of linear, time-invariant systems using an algorithm based on the fast gradient method and augmented Lagrange multipliers," CCA 2011: 780-785, 2011.

However, those methods are limited in the application by the types of constraints that can be handled, e.g., Richter et al., or can only handle input constraints, or need to perform division operations, e.g., in U.S. Publication 20120281929, which are time consuming in the computing hardware for MPC, or by complex iteration, e.g. Kögel et al., due to the need of achieving the solution of the Lagrangian-augmented problem, which is complex due to the presence of constraints, before updating the Lagrange multipliers, multipliers at every update.

Thus, there is a need to provide a method that can solve large scale problems with small computational complexity per iteration, good convergence when problems are feasible, and quick detection of infeasibility.

SUMMARY OF THE INVENTION

The embodiments of the invention provide a method for solving quadratic programs (QPs) for a convex set with a set of general linear equalities and inequalities by an alternating direction method of multipliers (ADMM). The method determines an optimal solution, or alternatively certifies that no solution to the problem exists. The embodiments also provide a method for optimizing a step size $\beta$ for the ADMM, which achieves convergence with a least number of iterations.

Of special interest is the application of ADMM to QPs that are solved for Model Predictive Control (MPC), where inequalities represent constraints on states and controls of a dynamic system, and the equalities represent the equations of the system dynamics that couple the variables of the optimization problem. Other applications include machine learning and compressive sensing.

The embodiments of the invention overcome the difficulties of prior art methods by performing only simple operations in iterations, in contrast with U.S. Pat. Nos. 8,600,525, 7,328,074, an U.S. Publication 20060282177, and do not involve divisions as in U.S. Publication 20120281929, and perform low complexity iterations by alternatively updating subsets of Lagrange multipliers by single iterations, rather than updating the entire set of multipliers, which involves only simple constraints.

The embodiments provide the optimal selection for the step size $\beta$ of the ADMM iteration, which minimizes the number of iterations performed by the method to a least number, and hence achieves the maximal rate of execution of a MPC controller for a given computing hardware.

In one embodiment, the MPC problem is decomposed into two blocks. The first block corresponds to an equality constrained QP, and the second block corresponds to a projection onto the MPC inequalities. The MPC problem also can be decomposed into a set of time step problems, and then iterated between the time step problems to solve the decoupled problems until convergence.

Furthermore, the embodiments allow for an early and effective detection of in feasibility, meaning that the method, on termination, certifies that no solution exists for the QP problem. The embodiments also described a solution that minimizes violations of the constraints.

DETAILED DESCRIPTION OF THE PREFERRED EMBODIMENTS

Figure 1:
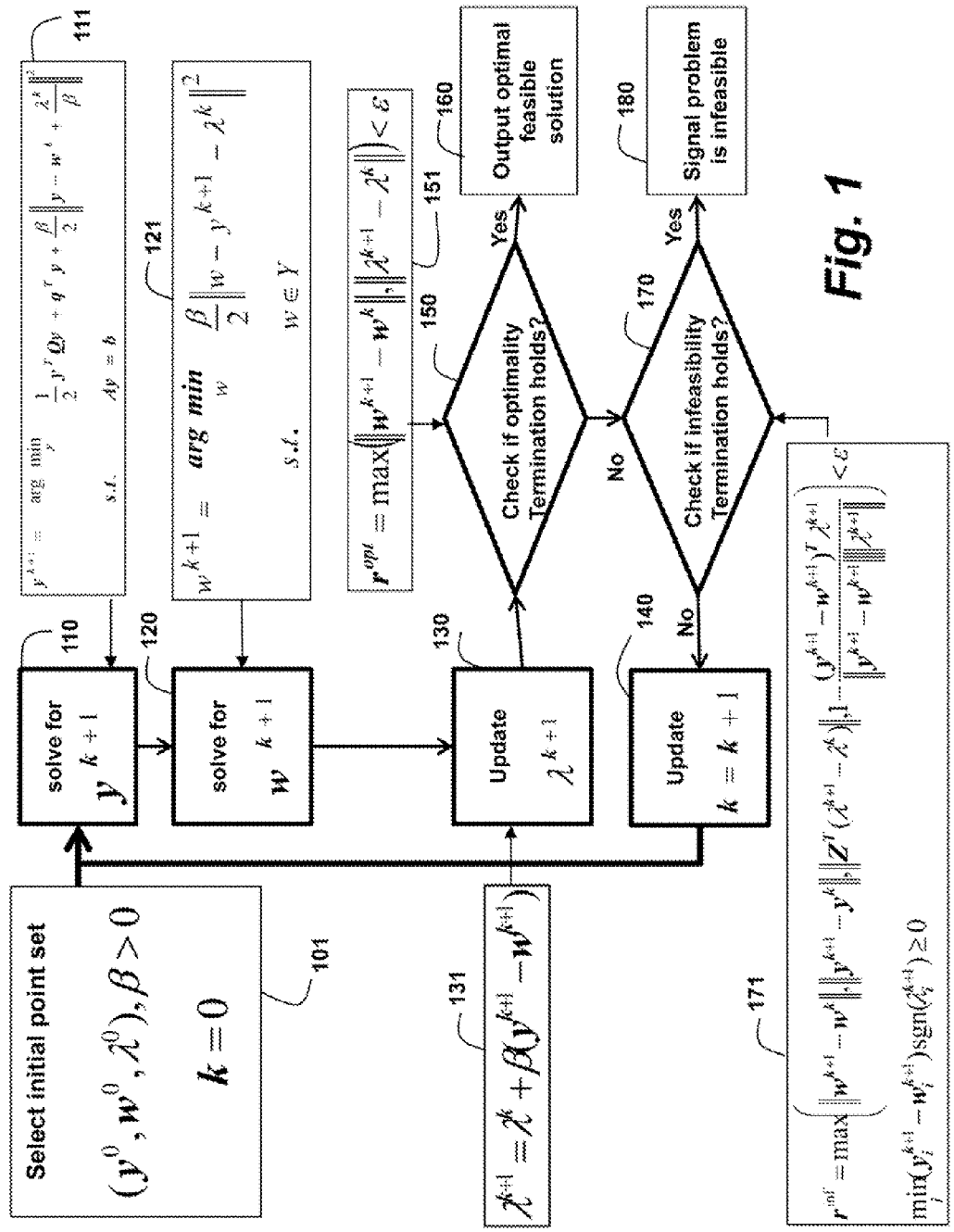
FIG. 1 is a flow diagram of a method for solving a quadratic program by an alternating direction method of multipliers (ADMM) according to embodiments of the invention.

As shown in FIG. 1, the embodiments of the invention provide a method for solving a quadratic program (QP) for a convex set with general linear equalities and inequalities by an alternating direction method of multipliers (ADMM). The method optimizes the step size $\beta$ of the ADMM to reduce the number of required iterations.

Figure 2B:
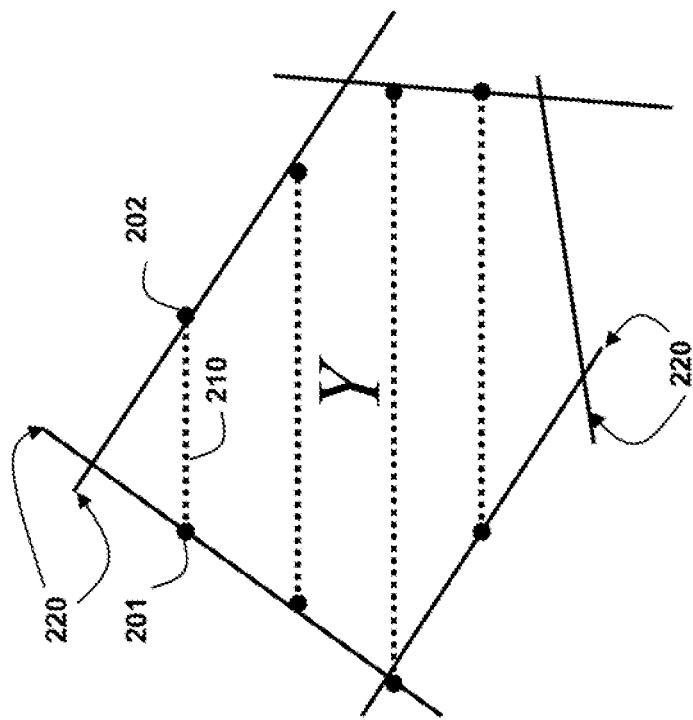
FIG. 2B is a schematic of a convex region Y defined as hyperplanes that can be solved by embodiments of the invention.
Figure 2A:
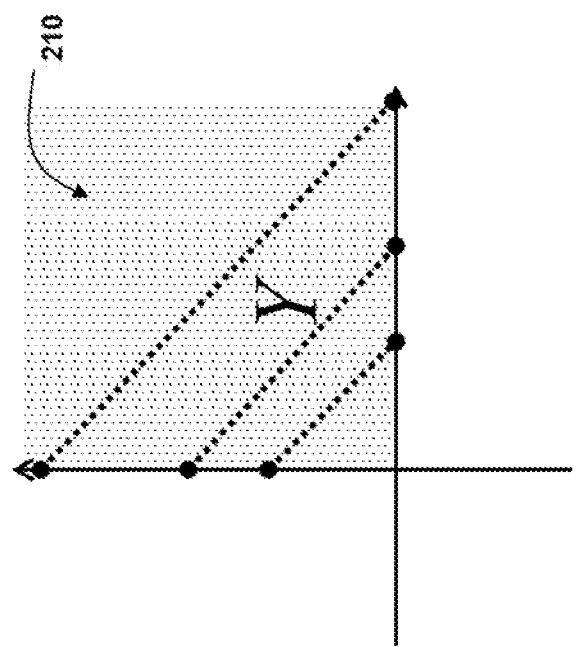
FIG. 2A is a schematic of a convex set Y defined as a non-negative orthant that can be solved by embodiments of the invention.

FIGS. 2A, 2B and 2C shows example convex sets Y that can be solved by the embodiments of the invention. In Euclidean space, a set is convex when, for every pair of points 201-202 in the set, every point on a straight line segment 210 that joins the pair of points is also in the set.

Specifically, FIG. 2A shows a convex set Y defined as a non-negative orthant 210. FIG. 2B is a schematic of a convex set Y defined as hyperplanes 220. Not sure why we have this figure, it is not related to anything in the spec or applications mentioned.

The uses of the methods described herein, representative equations, variables and parameters are specifically described below for three example applications, namely (I) model predictive control (MPC), (II) support vector machine (SVM) classification, and (III) compressive sensing (CS).

The QP can be expressed as $$\min_{y} \quad \frac{1}{2} y^T Q y + q^T y \quad (1)$$
$$\text{such that (s.t)} \quad Ay = b,$$
$$y \in Y$$

where a function min returns a minimum, superscript T is a transpose operator, q is column vector of dimension n, Q is a symmetric, positive semi-definite matrix of dimension n×n, b is column vector of dimension m<n, A is matrix of dimension n×n and a full row rank m, y is a known column vector of dimension n, and Y is the convex set. The matrix A is called the equality constraint matrix and each row of the matrix specifies the coefficients for the variables involved in each of the linear equalities. The matrix Q is called the Hessian of the objective function.

An orthonormal basis for the matrix $A^T$ is R, and an orthonormal basis for a null space of the matrix A is a matrix Z. The following assumptions are stipulated on the data of the problem. The matrix A has full row rank of m. The convex set Y is nonempty. The matrix $Z^T Q Z$ is positive definite, q, Q, A, b, and Y represent data of the QP, and y is known.

Equation (1) can be reformulated as $$\min_{y,w} \quad \frac{1}{2} y^T Q y + q^T y \quad (1A)$$
$$\text{s.t.} \quad Ay = b, w \in Y \quad .$$
$$y = w$$

where w is inequality constrained variable vector or a set constrained vector. The vector of variables y is the equality constrained variable vector, or alternatively the linear subspace constrained variable vector.

The advantage of Equation (1A) is that inequalities are placed on different variables, which are coupled through y=w. The ADMM dualizes the coupling constraint in the objective using the Lagrangian multiplier $\lambda$, and augments the objective with a penalty on the squared norm of the violation of the equality constraints as expressed below, $$\min_{y,w} \quad \frac{1}{2} y^T Q y + q^T y + \frac{\beta}{2} \left\| y - w + \frac{\lambda}{\beta} \right\|^2 \quad (1B)$$
$$\text{s.t.} \quad Ay = b, w \in Y$$

The problem formulated in Equation (1B) is still coupled in the variables through the objective function term $$\left\| y - w + \frac{\lambda}{\beta} \right\|^2$$

that penalizes deviation in the variables y and w. The objective function in (1B) is called the Lagrangian augmented quadratic objective function. The advantage of ADMM is that it simplifies this problem by alternating between solving for the linear subspace constrained variable vector y while keeping the set constrained variable vector w fixed, and then solving for w while keeping y fixed. Alternatively, the variables y and w can be solved in a reverse order. The steps of the ADMM according to embodiments of the invention are described next.

Alternating Direction Method of Multipliers (ADMM)

As shown in FIG. 1, the ADMM method solves Equation (1) by performing the following steps starting from some initial selected 101 point ($y^0$, $w^0$, $\lambda^0$) and step size $\beta > 0$ at iteration k=0 until termination conditions are satisfied for iterations k=1, 2, . . . . Because of on optimal sections of the step size $\beta$, k is minimized to a least possible number.

At each iteration of the ADMM, the method first solves Equation (1B) for the linear subspace constrained variable vector y while fixing the set constrained variable vector w and Lagrangian multiplier $\lambda$ to the current value of the iterate $w^k$, $\lambda^k$. Based on the formulation in Equation (1B) this amounts to solving an equality constrained QP as described below.

Step 110 solves for $y^{k+1}$ according 111 to $$y^{k+1} = \arg\min_y \; \frac{1}{2}y^T Q y + q^T y + \frac{\beta}{2}\left\| y - w^k + \frac{\lambda^k}{\beta} \right\|^2, \quad (2)$$
$$\text{s.t.} \quad Ay = b$$

where an optimal choice for the step size $\beta$ is described below. In the conventional ADMM, the parameter $\beta$ is selected arbitrarily because the ADMM method can obtain a solution for all $\beta > 0$. In fact, if the step size $\beta$ is optimally fixed over the iterations then, the solution of Equation (2) can be written as the following linear equation:

$$y^{k+1} = M\left(w^k - \frac{\lambda^k}{\beta} - q\right) + Nb, \quad (2A)$$
$$\text{where, } M = Z(Z^T(Q/\beta + I)Z)^{-1}Z^T,$$
$$N = (1 - MQ/\beta)R(AR)^{-1}b.$$

Thus, the solving for y reduces to only a matrix-vector multiplication, followed by the addition of vectors, which can be performed in conventional processors at high rates.

The solving for the w is accomplished by solving Equation (1B) while fixing y and $\lambda$ to the current value of the iterate $y^{k+1}$, $\lambda^k$. Based on the formulation in Equation (1B) this result amounts to solving a projection of the vector $y^{k+1} + \lambda^k / \beta$ on to the convex set Y as described below.

Step 120 solves for $w^{k+1}$ according to 121

$$w^{k+1} = \arg\min_w \; \frac{\beta}{2}\left\| w - y^{k+1} - \frac{\lambda^k}{\beta} \right\|^2, \quad (3)$$
$$\text{s.t.} \quad w \in Y$$

The update of w in Equation (3) is independent of the current value $\beta$ because the step size scales the objective function. Furthermore, for simple sets such as $Y = [y^l, y^u]$, where $y^l$, $y^u$ are respectively the lower and upper bounds on the variables with $y^l \leq y^u$ can be accomplished as $$w^{k+1} = \max\left(y^l, \min\left(y^u, y^{k+1} + \frac{\lambda^k}{\beta}\right)\right). \quad (3A)$$

Clearly, this step can also be accomplished in a computationally efficient manner. Also, note that the update in Equation (3A) is component-wise separable, and hence can easily be performed in parallel in computing hardware containing multiple computing units such as a graphic processing unit (GPU), field programmable gate array, or FPGA, single instruction, multiple data (SIMD hardware).

Step 130 updates the Lagrangian multiplier $\lambda^{k+1}$ according to 131

$$\lambda^{k+1} = \lambda^k + \beta(y^{k+1} - w^{k+1}), \quad (4)$$

where the updating of the Lagrange multiplier uses a difference between the linear subspace constrained variable vector and the set constrained variable vector multiplied by an optimal step size parameter $\beta$.

Termination Condition

Given a predetermined tolerance $\epsilon > 0$, a termination condition 150 for an optimal feasible solution 160 is $$r^{opt} = \max(\|w^{k+1} - w^k\|, \|\lambda^{k+1} - \lambda^k\|) < \epsilon 161. \quad (5)$$

If the termination condition for the feasible solution is satisfied, then the optimal feasible solution is output. The termination condition in Equation (5) checks for the satisfaction to the tolerance $\epsilon$ greater than zero of a maximum of a norm of a change in the set constrained variable w from a current value to a value at a previous iteration, and a norm of the change in the Lagrange multiplier $\lambda$ from a current value to a value at a previous iteration.

For $\epsilon > 0$, a termination condition 170 for certifying a solution to the problem is infeasibility 180 is shown in block 171:

$$r^{inf} = \max\left(\|w^{k+1} - w^k\|, \|y^{k+1} - y^k\|, \right. \quad (6)$$
$$\left. \|Z^T(\lambda^{k+1} - \lambda^k)\|, 1 - \frac{(y^{k+1} - w^{k+1})^T \lambda^{k+1}}{\|y^{k+1} - w^{k+1}\| \|\lambda^{k+1}\|} \right) < \varepsilon,$$
$$\min_i (y_i^{k+1} - w_i^{k+1}) \text{sgn}(\lambda_i^{k+1}) \geq 0,$$

where the function sgn returns the sign of the operand, i.e., 1 if the operand is greater than equal to 0 and −1 otherwise. If the termination condition for the infeasible solution is satisfied, then certification that the solution is infeasible can be signaled.

The termination condition in Equation (6) checks for the satisfaction to a tolerance greater than zero of the maximum of the normed change in set constrained variable w from a current value to a value at a previous iteration, normed change in linear subspace constrained variable y from a current value to a value at a previous iteration, normed change in the Lagrange multiplier variable $\lambda$ from a current value to a value at a previous iteration along the null space of the equality constraints and deviation from 0 of the angle between the Lagrange multiplier vector $\lambda$ and the vector resulting from the difference of linear subspace constrained variable and set constrained variable (y−w) at the current value, and also requiring that the difference of linear subspace constrained variable and set constrained variable at the current value have, element-wise, the same sign as the Lagrange multiplier vector.

Otherwise, iterate 140 for a next iteration k=k+1.

The general method can be implemented in a processor or other hardware as describe above connected to memory and input/output interfaces by buses as known in the art.

Optimal Parameter Choice

The choice of the step size $\beta$, which ensures that a least number of iterations are required for termination of the ADMM method is $$\beta^{opt} = \sqrt{\sigma^{min}(Z^T Q Z) \sigma^{max}(Z^T Q Z)}, \quad (7)$$

where $\sigma^{min}(\ )$, $\sigma^{max}(\ )$ are minimal and maximal eigenvalues of contained matrix arguments.

In other words, the optimal step size is determined as a square root of a product of minimum and maximum eigenvalues of a Hessian matrix of the QP problem pre- and post multiplied by an orthonormal basis for a null space of a linear equality constraint matrix.

Applications

The embodiments of the invention can be used in various applications as described below.

(I) Model Predictive Control

Figure 3:
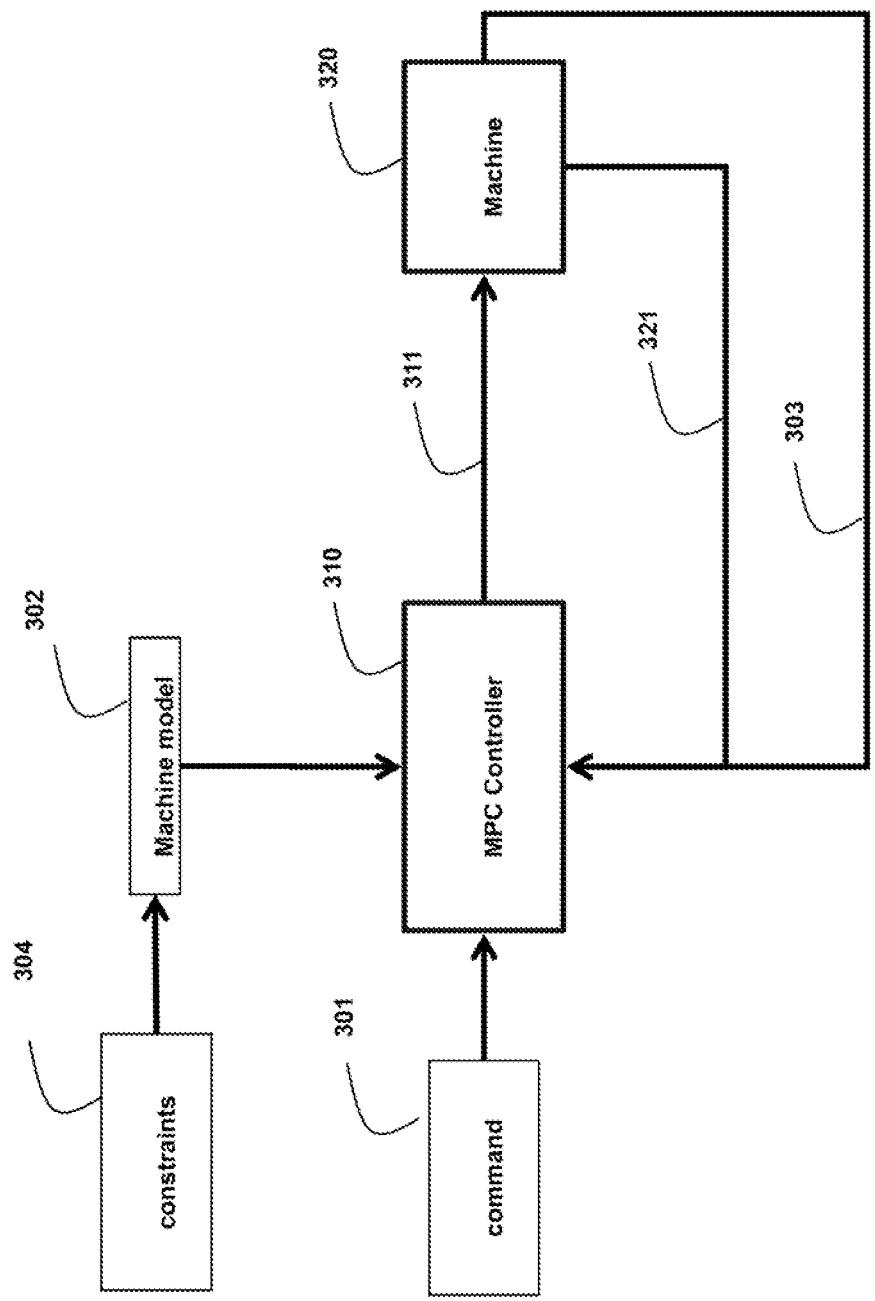
FIG. 3 is a block diagram of a controller and machine using the ADMM according to embodiments of the invention.

FIG. 3 shows a model predictive control (MPC) controller 310 connected to an example machine 320 according to some embodiments of the invention. The controller 310 is operates according to a model 302 of the machine. The model can be a set of equations representing changes of the output 303 of the machine over time as functions of current and previous inputs 311 and previous outputs. The model can include constraints 304 that represent physical and operational limitations of the machine. One embodiment expresses the model 302 as a linear difference equation $$x_m(k+1) = A_m x_m(k) + B_m u(k)$$

$$y_o(k) = C_m x_m(k) + D_m u(k), \quad (8)$$

where $x_m$ is the state of the machine, y is the current output, k is a time when the signals are sampled, and $A_m$, $B_m$, $C_m$, and $D_m$, are parameters of the model.

During the operation, the controller receives a command d 301 indicating the desired behavior of the machine. The command can be, for example, a motion command. In response to receiving the command 301, the controller generates input u 311 for the machine. In response to the input, the machine updates the current output $y_o$ 303 and the state $x_m$ 321 of the machine.

Figure 4:
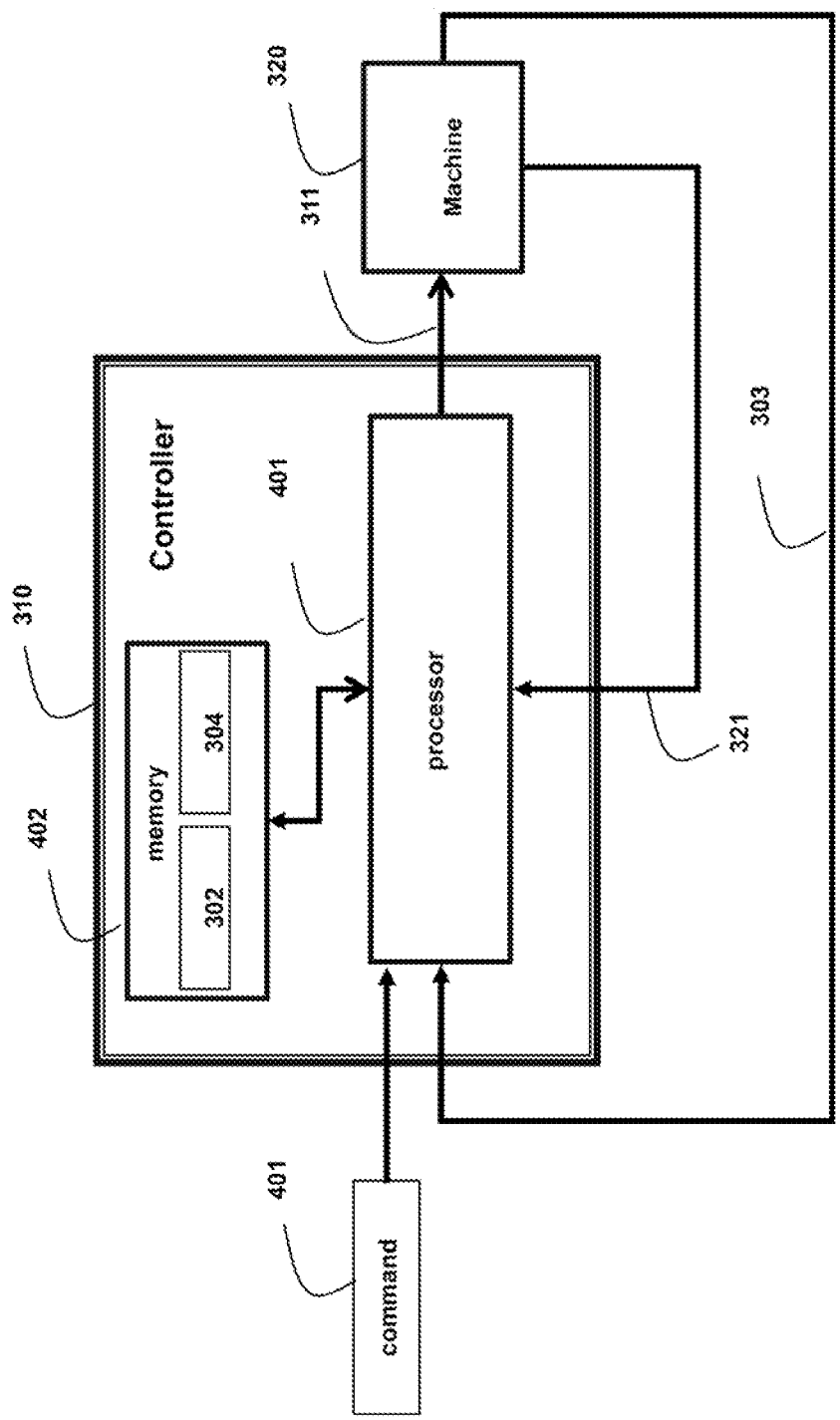
FIG. 4 is a block diagram of the controller using the ADMM according to embodiments of the invention.

FIG. 4 shows a block diagram of the controller 310 according one embodiment of the invention. The controller 310 includes a processor 401 connected to a memory 402 for storing the model 302, and the constraints 304. The controller actuates the machine so that the machine output follows a desired motion, also called a reference signal, which is the output generated by a reference model that represents the desired motion of the machine as specified by an operator or a supervisory software $$v(k+1) = A_r v(k)$$

$$r(k) = C_r v(k), \quad (9)$$

where v is a reference state of the reference model, r is a reference output of the reference model, and $A_r$, $C_r$, are the parameters of the reference model.

One embodiment determines a comprehensive model of the system by joining the models of Equation 8 and Equation 9 to form the equations that define the prediction model dynamics $$x(k+1) = A_p x(k) + B_p u(k)$$

$$y(k) = C_p x(k) + D_p u(k), \quad (10)$$

$$z(k) = C_c x(k) + D_c u(k)$$

where the full state x, which is a vector of size nx, includes the machine state $x_m$, the reference model state v, the full output y is a vector with size ny, and the full input u, which is a vector with size nu, is the same as in Equation (8), and $A_p$, $B_p$, $C_p$, $D_p$, are obtained from $A_m$, $B_m$, $C_m$, $D_m$, $A_r$, $C_r$.

For example, in some cases $$A_p = \begin{bmatrix} A_m & 0 \\ 0 & A_r \end{bmatrix}, B_p = \begin{bmatrix} B_m \\ 0 \end{bmatrix}, C_p = [C_m \ -C_r], D_p = D_m,$$

$$x = \begin{bmatrix} x_m \\ v \end{bmatrix},$$

where 0 indicates matrices of all-zeros elements. In Equation (10) z is a vector of constrained outputs, of size nz modeling constraints on the machine that are formulated with respect to combination of states and/or inputs and are not defined on a single state or input, and $C_c$ and $D_c$ are the parameters that define the constraint. For example, a constraint on the sum of the first and second component of the state vector and the first component of the input vector can be expressed as a variable z in Equation (10) where $$C_c = [1 \ 10 \ \ldots \ 0], D_c = [1 \ 0 \ \ldots \ 0]$$

The operation of the machine is subject to constraints 304 that describe physical and operational limits expressed, e.g., by a set of linear inequalities $$m_x \leq x \leq M_x,$$

$$m_u \leq u \leq M_u, \text{ and} \quad (11)$$

$$m_z \leq z \leq M_z,$$

where $M_x$, $m_x$ are vectors of the size of the full state x, and $M_u$, $m_u$ are vectors of the size of the full input u, $M_z$, $m_z$ are vectors of the size of the constrained output z.

Figure 5:
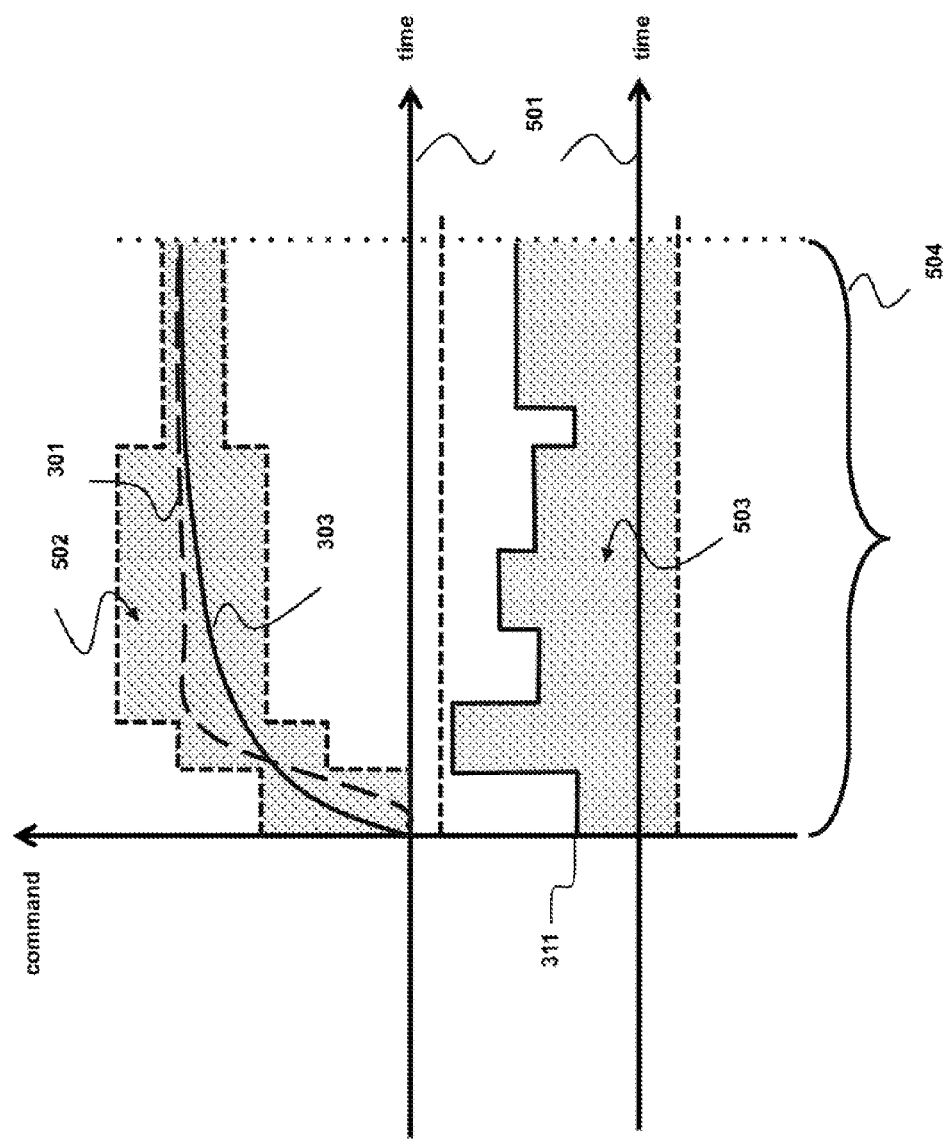
FIG. 5 is a timing diagram of machine motions using the ADMM according to embodiments of the invention.

FIG. 5 shows a timing diagram of motions of the machine 320 according to some embodiments of the invention. The MPC controller 310 generates the input for the machine to perform the desired motion while enforcing the constraints using the expected machine behavior according to the model. The constraints can include regions of feasible motion 502 and feasible input 503.

The MPC, at each time k 501, solves a finite time optimal control problem for a prediction interval 504 of length N, i.e., from the current time until the N next times using the following cost function:

$$\min_{\substack{x(k+1),\ldots x(k+N) \\ u(k),\ldots u(k+N-1)}} x(k+N)^T P_x x(k+N) + \sum_{i=0}^{N-1} (x(k+i)^T Q_x x(k+i) + u(k+i)^T R_u u(k+i) + y(k+i)^T S_y y(k+i))$$

s.t. $Eqn\ (10), Eqn(11)$

Given $x(k)$ (12)

where $P_x$, $Q_x$, $R_u$ are symmetric positive definite or positive semidefinite weighting matrices and T indicates a vector transposition. The optimal solution is the machine the optimal trajectory for the machine state $x(k+1), \ldots, x(k+N)$ and output, $y(k+0), \ldots, y(k+N-1)$, and the optimal input generating such trajectory $u(k+0), \ldots, u(k+N-1)$. The optimal input is then applied all or in part, e.g., until the next time k+1, as input to the machine.

The output $y_m$ 303 following the command 301 for the desired motion r can be obtained by including in the cost function in Equation (12) the distance between r and $y_m$ according to $$y - r = [C_m \; -C_r] \cdot \begin{bmatrix} x_m \\ v \end{bmatrix} + 0_{ny \times nu} = C_p x + D_p u.$$

In one embodiment of this invention, the MPC problem in Equation (12) is cast in the form of the QP that can be cast in the form of Equation (1) by identifying the variables in matrices in Equation (1) with those of MPC as follows. The vectors of variables, which include a linear subspace constrained variable vector representing the system states, controls, and, optionally, outputs and constrained outputs $$y = \begin{bmatrix} x(k+1) \\ \vdots \\ x(k+N) \\ u(k) \\ \vdots \\ u(k+N-1) \\ y(k) \\ \vdots \\ y(k+N-1) \\ z(k) \\ \vdots \\ z(k+N-1) \end{bmatrix},$$

The matrix and vector that define the wherein the linear subspace constraints, that are the equations of the prediction model dynamics along the prediction interval, respectively $$A = \begin{bmatrix} A_p \otimes E_N - I_x \otimes I_N & B_p \otimes I_N & 0_{nx \times ny} \otimes I_N & 0_{nx \times nz} \otimes I_N \\ C_p \otimes E_N & D_p \otimes I_N & -I_{ny} \otimes I_N & 0_{ny \times nz} \otimes I_N \\ C_c \otimes E_N & D_c \otimes I_N & -0^T_{nz \times ny} \otimes I_N & I_{nz} \otimes I_N \end{bmatrix},$$

$$b = \begin{bmatrix} b_x \\ b_y \\ b_z \end{bmatrix}, b_x = \begin{bmatrix} -A_c x(k) \\ 0 \\ \vdots \\ 0 \end{bmatrix}, b_y = \begin{bmatrix} -C_c x(k) \\ 0 \\ \vdots \\ 0 \end{bmatrix}, b_x = \begin{bmatrix} -A_c x(k) \\ 0 \\ \vdots \\ 0 \end{bmatrix}$$

where ∞ indicates infinity, and $\pm\infty_y$ are vectors of the same size as y entirely composed of plus or minus ∞, thus indicating unbounded quantities, $\otimes$ denotes the matrix Kronecker product, $E_N$ is a N×N diagonal matrix with the first and last diagonal entry being 0 and the rest of diagonal entries set to 1, $0_{a \times b}$ denotes the 0 matrix with number of rows a and number of columns b, and $I_a$ is a square identity matrix of size a.

The upper and lower bounds vectors $$y^l = \begin{bmatrix} m_x \\ \vdots \\ m_x \\ m_u \\ \vdots \\ m_u \\ -\infty_y \\ \vdots \\ -\infty_y \\ m_z \\ \vdots \\ m_z \end{bmatrix}, y^u = \begin{bmatrix} M_x \\ \vdots \\ M_x \\ M_u \\ \vdots \\ M_u \\ \infty_y \\ \vdots \\ \infty_y \\ M_z \\ \vdots \\ M_z \end{bmatrix},$$

that define the set $$Y = \{\omega : y^l \le \omega \le y^u\}$$

for use in the set constraints $$w \in Y,$$

where w is an auxiliary variable vector of the same size as y.

The quadratic term of the cost function Q, which is a matrix having columns and rows equal to the size of vector y $$Q = \begin{bmatrix} \begin{bmatrix} Q_x \otimes I_{N-1} & 0 \\ 0 & P_x \end{bmatrix} & 0_{nx \times nu} \otimes I_N & 0_{nx \times ny} \otimes I_N & 0_{nx \times nz} \otimes I_N \\ 0^T_{nx \times nu} \otimes I_N & R_u \otimes I_N & 0_{nu \times ny} \otimes I_N & 0_{nu \times nz} \otimes I_N \\ 0^T_{nx \times ny} \otimes I_N & 0^T_{nu \times ny} \otimes I_N & 0_{ny \times ny} \otimes I_N & 0_{ny \times nz} \otimes I_N \\ 0^T_{nx \times nz} \otimes I_N & 0^T_{nu \times nz} \otimes I_N & 0^T_{ny \times nz} \otimes I_N & 0_{nz \times nz} \otimes I_N \end{bmatrix},$$

and $$q = \begin{bmatrix} 0 \\ \vdots \\ 0 \end{bmatrix}$$

is a vector of the same length of y that represents the linear term of the cost function.

(I) Based on the matrices and vectors A, B, Q, q, the optimal value of the ADMM parameter β is computed as described in Equation (7). Thus the application of ADMM to the MPC problem results in alternating between:

(i) the solution of an quadratic programming problem where the vector of variables is composed of the system states, controls, and, optionally, outputs and constrained outputs, and solution is constrained in a linear subspace defined by the equations of the prediction model dynamics along the prediction interval; and (ii) the projection of an auxiliary vector into the set defined by upper and lower bounds on system states, controls, and, optionally, outputs and constrained outputs along the prediction interval; and (iii) updating the Lagrangian from the difference between the vector of variables composed of the system states, controls, and, optionally, outputs and constrained outputs and the auxiliary vector scaled by the ADMM parameter β

(II) Machine Learning

In machine learning, support vector machines (SVMs) are supervised learning models with associated learning algorithms that analyze data and recognize patterns, used for classification and regression analysis. Given a set of training samples, where each sample is marked as belonging to one of two categories, an SVM training algorithm builds a model that assigns new examples into one category or the other, making SVM a non-probabilistic binary linear classifier. The SVM model is a representation of the samples as points in a (multi-dimensional) space, mapped so that the examples of the separate categories are separated by a clear gap, represented by a hyperplane, that is as wide as possible. New samples are then mapped into that same space and predicted to belong to a category based on which side of the gap the sample is mapped to.

Classifying data is a common task in machine learning. Suppose, given some data points, each belonging to one of two classes, the goal is to decide to which class a new data point belongs. In the case of support vector machines, a data point is viewed as a p-dimensional vector (a list of p numbers), and we want to know whether we can separate such points with a (p−1)-dimensional hyperplane. This is called a linear classifier. There are many hyperplanes that might classify the data. One reasonable choice as the optimal hyperplane is the one that represents the largest separation, or margin, between the two classes. Therefore, the hyperplane is selected to maximize the distance to the nearest data point on each side. If such a hyperplane exists, then it is known as the maximum-margin hyperplane, and the linear classifier is known as a maximum margin classifier; or equivalently, a perceptron of optimal stability.

Linear SVM

Given some training data D, a set of n points of the form $$D=\{(x_i,z_i)|x_i \in R^p, z_i \in \{-1,1\}\}_{i=1}^n,$$

where the $z_i$ is either 1 or −1, indicating the class to which the point $x_i$ belongs. Each $x_i$ is a p-dimensional real vector. The linear SVM finds the maximum-margin hyperplane that partitions the points having $z_i=1$ from those having $z_i=-1$.

Figure 6:
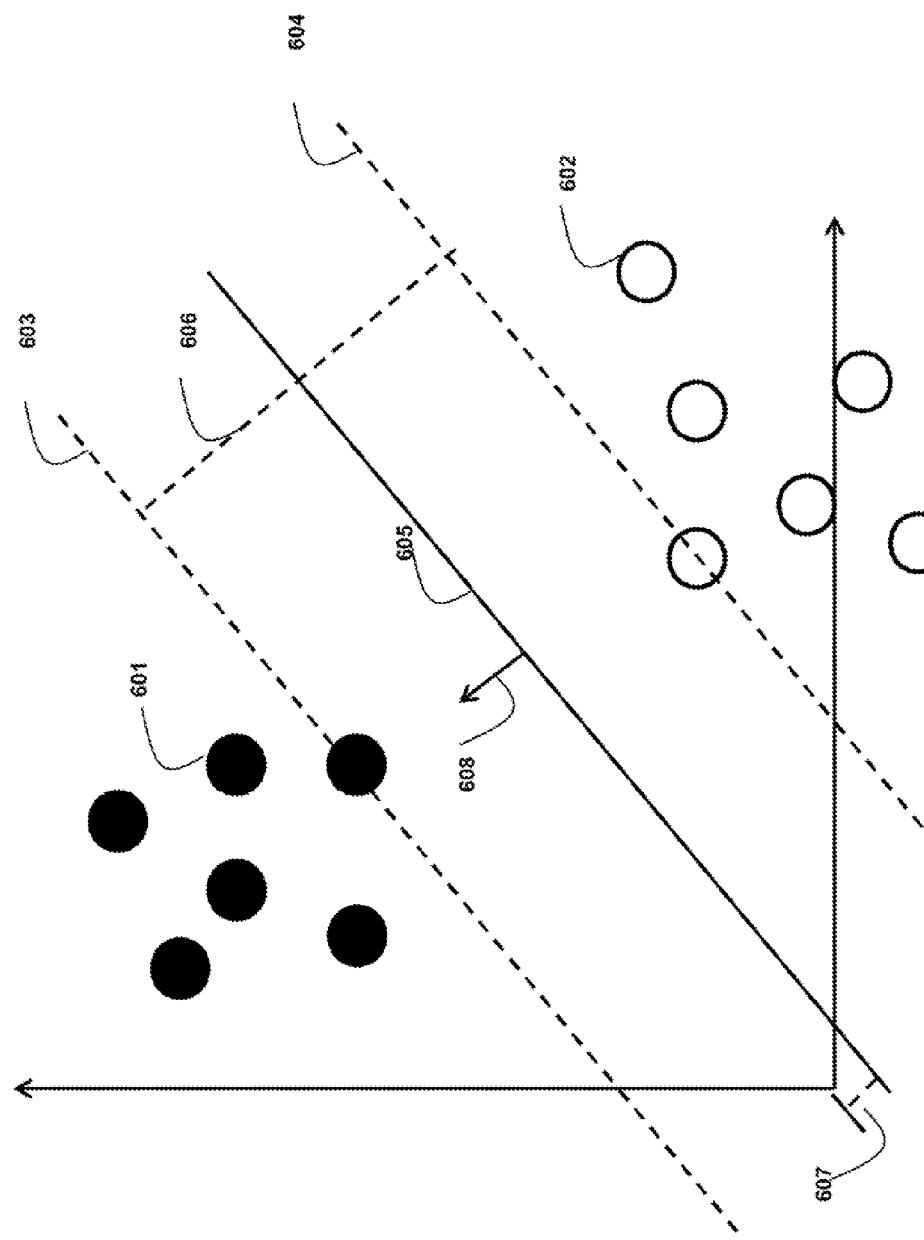
FIG. 6 is a schematic of hyperplanes separating two classes of points by linear support vector machines.
Figure 7:
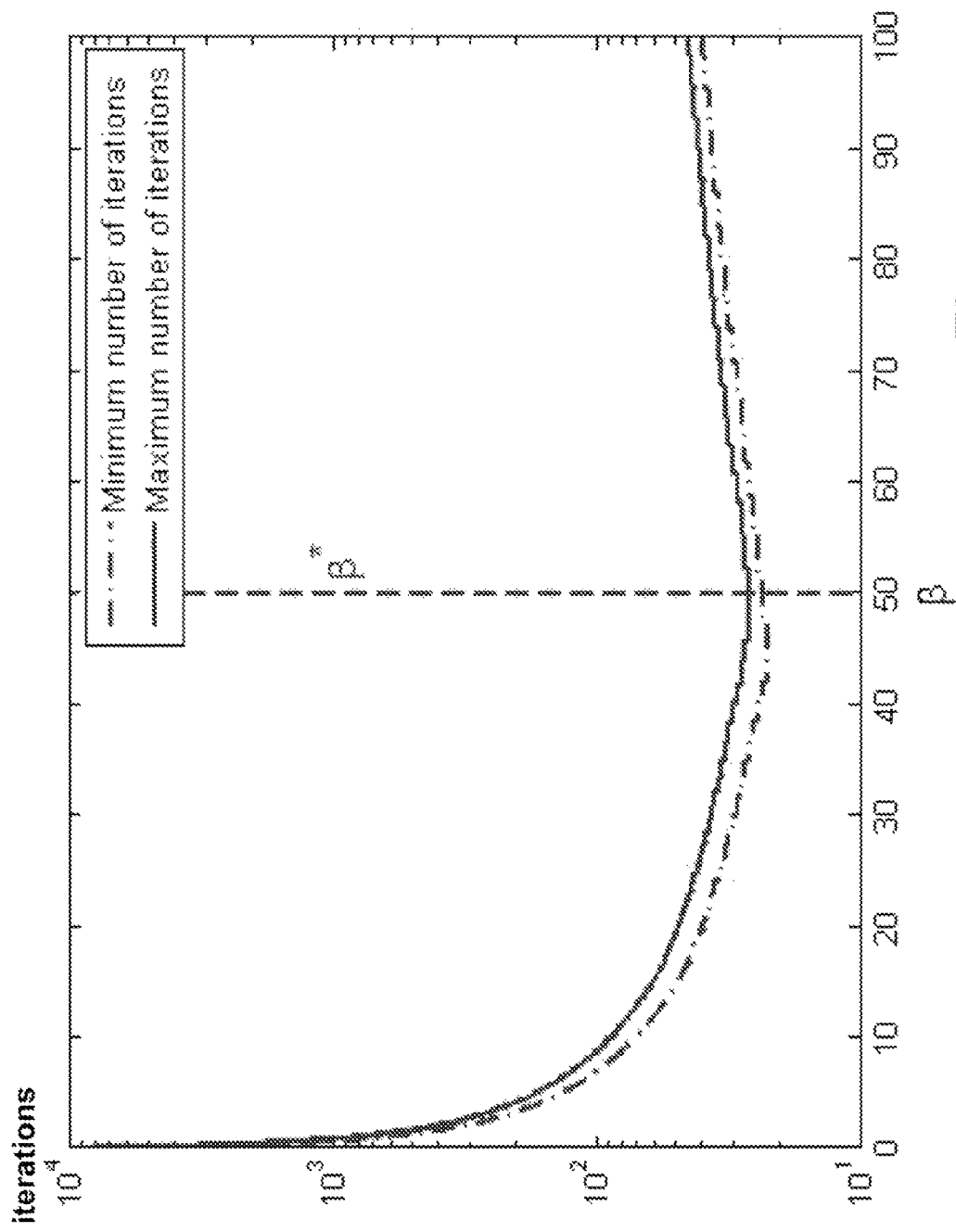
FIG. 7 is a graph of iterations as a function of step size according to embodiments of the invention.

FIG. 6 shows a representation of 2 sets of points 601 with label 1, 602 with label −1 that need to be classified using linear hyperplanes. Any hyperplane can be written as the set of points x satisfying $v^T x - b = 0$ 605, where v is the (not necessarily normalized) normal vector to the hyperplane 608. The parameter $$\frac{b}{\|v\|} 607$$

determines the offset of the hyperplane from the origin along the normal vector v.

If the training data are linearly separable, two hyperplanes can be selected in a way that the hyperplanes separate the data, and there are no points between the hyperplanes, and then try to maximize the distance between the hyperplanes. The region bounded by the hyperplanes is called "the margin." These hyperplanes can be described by the equations $$v^T x - b = 1 \; 603,$$

and $$v^T x - b = -1 \; 604.$$

By using geometry, we find the distance between these two hyperplanes is $$\frac{2}{\|v\|}$$

to minimize $\|v\|$. To prevent data points from falling into the margin, the following constraint is added: for each i either $$v^T x_i - b \geq 1 \text{ for } x_i \text{ of the first class}$$

or $$v^T x_i - b \leq -1 \text{ for } x_i \text{ of the second}.$$

This can be rewritten as:

$$z_i(v^T x_i - b) \leq 1 \text{ for all } i=1, \ldots, n$$

and are called the margin constraints.

Combining all the above constraints, the linear SVM can be cast as the optimization problem:

$$\min_{v,b} \quad \frac{1}{2} v^T v \tag{13}$$
$$\text{s.t.} \quad z_i(v^T x_i - b) \geq 1 \text{ for all } i = 1, \ldots, n$$

The optimization problem in Equation (13) can be cast in the form of Equation (1) by identifying the problem data in Equation (1) with those in Equation (13) as follows, $$y = \begin{bmatrix} v \\ s \\ b \end{bmatrix}, A = \begin{bmatrix} z_1 x_1^T & -1 & -z_1 \\ \ldots & \ldots & \ldots \\ z_n x_n^T & -1 & -z_n \end{bmatrix}, b = \begin{bmatrix} 1 \\ \ldots \\ 1 \end{bmatrix},$$

$$Q = \begin{bmatrix} I_p & 0_{p \times n} & 0_{p \times 1} \\ 0_{p \times n}^T & 0_{n \times n} & 0_{n \times 1} \\ 0_{p \times 1}^T & 0_{n \times 1}^T & 0 \end{bmatrix}$$

$$Y = [y^l, y^u], y^l = \begin{bmatrix} -\infty_p \\ 0_n \\ -\infty \end{bmatrix}, y^l = \begin{bmatrix} \infty_p \\ \infty_n \\ \infty \end{bmatrix},$$

and where, s is a n-dimension slack variable vector which is used to convert the inequalities in Equation (13) to equality constraints. In the above formulation, the variables s are called the slack variables for the margin constraints. The margin constraints are augmented with the slacks variables to convert the margin constraints to equalities.

The SVM is Equation (13) is called the biased SVM. In some application, the separating hyperplane is required to pass through the origin which leads to the following optimization problem, $$\min_{v,b} \quad \frac{1}{2} v^T v \tag{14}$$
$$\text{s.t.} \quad z_i(v^T x_i) \geq 1 \text{ for all } i = 1, \ldots, n$$

The optimization problem in Equation (13) can be cast in the form of Equation (1) by identifying the problem data in Equation (1) with those in Equation (13) as follows, $$y = \begin{bmatrix} v \\ s \end{bmatrix}, A = \begin{bmatrix} z_1 x_1^T & -1 \\ \ldots & \ldots \\ z_n x_n^T & -1 \end{bmatrix}, b = \begin{bmatrix} 1 \\ \ldots \\ 1 \end{bmatrix},$$

$$Q = \begin{bmatrix} I_p & 0_{p \times n} \\ 0_{p \times n}^T & 0_{n \times n} \end{bmatrix}$$

$$Y = [y^l, y^u], y^l = \begin{bmatrix} -\infty_p \\ 0_n \end{bmatrix}, y^l = \begin{bmatrix} \infty_p \\ \infty_n \end{bmatrix}.$$

In the above formulation, the variables s are called the slack variables for the margin constraints.

(III) Compressive Sensing

Compressive Sensing (CS) acquires and recovers a sparse signal in the most efficient way possible, e.g., by subsampling, with the help of an incoherent projecting basis. Unlike traditional sampling methods, CS provides a framework for acquiring sparse signals in a mutiplexed manner. After a signal is known to be sparse in a specific basis, one of the main challenges is to find a set of measurement tools (producing the compressed measurements) and a nonlinear solver that reconstructs the original full signal. There are theoretical results yielding the minimum number of required measurements needed to produce the original signal given a specific pair of measurement matrices and nonlinear solvers. In all cases, the expected number of compressed measurements is expected to be low relative to Nyquist sampling constraints.

Compressive sensing can be described as follows. Given a measurement $z \in R^p$ of a signal, a signal vector $x \in R^n$, and the measurement matrix that produces the signal $z = \Phi x$, $\Phi \in R^{p \times n}$, the compressive sensing determines the sparsest signal x (fewest number of nonzero entries) that matches the measurement, that is, $$\min_x \|x\|_0 \qquad (15)$$
$$\text{s.t.} \quad z = \Phi x,$$

where $\|x\|_0$ is the count of the number of nonzeros in the signal vector x. The linear equality constraints in Equation (15) are called the measurement constraints. The optimization problem in Equation (15) is NP-hard and this commonly approximated using the $L_1$ norm as, $$\min_x \|x\|_1 \qquad (16)$$
$$\text{s.t.} \quad z = \Phi x,$$

where $$\|x\|_1 = \sum_{i=1}^n |x_i|$$

is the sum of the absolute values of the entries in x. Typically, the problem in (16) solved in conjunction with a regularization term as, $$\min_x \|x\|_1 + \frac{\rho}{2} x^T x \qquad (17)$$
$$\text{s.t.} \quad z = \Phi x,$$

where $\rho > 0$ is a small positive constant, which can be equivalently formulated as, $$\min_x \sum_{i=1}^n t_i + \frac{\rho}{2} x^T x \qquad (18)$$
$$\text{s.t.} \quad \begin{array}{l} z = \Phi x \\ -t_i \le x_i \le t_i \text{ for all } i = 1, \ldots, n \end{array}$$

The optimization problem in Equation (18) can be cast in the form of Equation (1) by identifying the data matrices of Equation (18) with those in Equation (1) as follows, $$y = x, A = \Phi, b = z,$$

$$Y = \left\{ \begin{bmatrix} x \\ t \end{bmatrix} \middle| -t_i \le x_i \le t_i \text{ for all } i = 1, \ldots, n \right\}$$

$$Q = I_n.$$

In this application to CS, the Lagrangian augmented quadratic objective function can be written as, $$\min_{y,w,t} \sum_{i=1}^n t_i + \frac{\rho}{2} y^T y + \frac{\beta}{2} \left\| y - w + \frac{\lambda}{\beta} \right\|^2$$
$$\text{s.t.} \quad \begin{array}{l} Ay = b \\ -t_i \le w_i \le t_i \text{ for all } i = 1, \ldots, n \end{array}$$

The update problem in variable y is a simple equality constrained QP, while the update problem in w can be recast as the following problem:

$$w^{k+1} = \arg\min_w \|w\|_1 + \frac{\beta}{2} \left\| y^{k+1} - w + \frac{\lambda^k}{\beta} \right\|^2,$$

where the $\| \|_t$ denotes the $L_1$ norm of the operand vector. The solution to the above problem is the shrinkage operator, $$w^{k+1} = \text{shrink}\left( y^{k+1} + \frac{\lambda^k}{\beta}, \frac{1}{\beta} \right).$$

The shrinkage operator is defined for scalar argument x as, $$\text{shrink}(x, \mu) = \begin{cases} 0 & \text{if } |x| \le \mu \\ \left(1 - \frac{\mu}{|x|}\right) x & \text{otherwise} \end{cases},$$

where it is understood the vector arguments is applied component-wise.

It is understood that all of the above methods, equations, variables and parameters can be implemented in a processor connected to memory and input/output interfaces by buses as known in the art.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for controlling a machine by solving a convex quadratic program (QP) for a convex set, wherein constraints of the QP include a set of linear equalities and a set of linear inequalities, wherein the solving uses an Alternating Direction Method of Multipliers (ADMM), wherein variables of the convex QP include a linear subspace constrained variable vector and a set constrained variable vector indicating desired behavior of the machine, comprising iterative steps:
    solving, using a processor, the linear subspace constrained variable vector while keeping the set constrained variable vector fixed using an optimal step size and a Lagrangian multiplier, wherein the optimal step size is determined as a square root of a product of minimum and maximum eigenvalues of a Hessian matrix of the QP problem pre- and post multiplied by an orthonormal basis for a null space of a linear equality constraint matrix;
    solving, using the processor, the set of constrained variable vector while keeping the linear subspace constrained variable vector fixed using the optimal step size and the Lagrangian multiplier;
    updating the Lagrangian multiplier;
    repeating for a next iteration until either a termination condition for a feasible solution is satisfied or a termination condition for an infeasible solution is satisfied to produce a QP solution including one or combination of values of the linear subspace constrained variable vector and the set of constrained variable vector; and
    controlling the machine using the OP solution.

2. The method of claim 1, wherein the solving for the linear subspace constrained variable vector minimizes a Lagrangian augmented quadratic objective function depending on the Lagrange multiplier and the set constrained variable vector subject to the set of linear equality constraints.

3. The method of claim 1, wherein the solving for the set constrained variable vector minimizes a Lagrangian augmented quadratic objective function depending on the Lagrange multiplier and the linear subspace constrained variable vector subject to the set of inequality constraints.

4. The method of claim 1, wherein the updating of the Lagrangian multiplier uses a difference between the linear subspace constrained variable vector and the set constrained variable vector multiplied by an optimal step size parameter.

5. The method in claim 1, wherein the termination condition for the feasible solution satisfies a tolerance greater than zero of a maximum of a norm of a change in the set constrained variable vector from a current value to a value at a previous iteration, and a norm of a change in the Lagrange multiplier from a current value to a value at a previous iteration.

6. The method in claim 1, where the termination condition for infeasible solution satisfies a tolerance greater than zero of a maximum of a normed change in set constrained variable vector from a current value to a value at a previous iteration, a normed change in the linear subspace constrained variable vector from a current value to a value at a previous iteration, a normed change in the Lagrange multiplier variable from a current value to a value at a previous iteration along the null space of the equality constraints and deviation from 0 of the angle between the Lagrange multiplier and the vector resulting from a difference of the linear subspace constrained variable vector and set constrained variable vector at the current value, and a difference of the linear subspace constrained variable vector and set constrained variable vector at the current value have element-wise a same sign as the Lagrange multiplier.

7. The method of claim 1, wherein the QP is for a model predictive controller, further comprising:
    solving the QP, wherein variables include a linear subspace constrained variable vector of system states, controls, and, optionally, outputs and constrained outputs along a prediction interval, and a set constrained auxiliary variable vector of a same size as the linear subspace constrained variable vector, wherein the linear subspace constraints are equations of prediction model dynamics along the prediction interval, and the set constraints are the upper and lower bounds on the system states, controls, and, optionally, the output and the constrained outputs along the prediction interval.

8. The method of claim 1, wherein the QP is for machine learning with a support vector machine, and further comprising:
    solving the QP, wherein variables include a linear subspace constrained variable of a size of a normal vector for a hyperplane separating samples and slack variables for margin constraints wherein the linear subspace constraints are the margin constraints augmented by the slack variables, and a set constrained variable vector has a same size as the hyperplane and the slack variables, and wherein the normal vector is unconstrained, and the slack variables are constrained to be nonnegative.

9. The method of claim 1, wherein the QP is for compressive sensing, and further comprising:
    solving the QP wherein variables include the linear subspace constrained variable vector of a size of a signal vector that is to be determined, wherein the linear subspace constrained variable vector includes measurements constraints, and a set constrained variable vector of the same size as the signal vector, wherein the linear subspace constrained variable vector constrains the linear subspace constrained variable by applying a shrinkage operator.

10. A method for controlling a machine by solving a convex quadratic program (QP) for a convex set, wherein constraints of the QP include a set linear equalities and a set of linear inequalities, wherein the solving uses an Alternating Direction Method of Multipliers (ADMM), wherein variables of the convex QP include a linear subspace constrained variable vector and a set constrained variable vector indicating desired behavior of the machine, comprising iterative steps:
    solving, using a processor, the linear subspace constrained variable vector while keeping the set constrained variable vector fixed using an optimal step size and a Lagrangian multiplier;
    solving, using the processor, the set of constrained variable vector while keeping the linear subspace constrained variable vector fixed using the optimal step size and the Lagrangian multiplier, wherein the solving for the set constrained variable vector minimizes a Lagrangian augmented quadratic objective function depending on the Lagrange multiplier and the linear subspace constrained variable vector subject to the set of linear equality constraints and the set of inequality constraints;

updating the Lagrangian multiplier;

repeating for a next iteration until either a termination condition for a feasible solution is satisfied or a termination condition for an infeasible solution is satisfied to produce a QP solution including one or combination of values of the linear subspace constrained variable vector and the set of constrained variable vector; and controlling the machine using the QP solution.

11. A method for controlling a machine by solving a convex quadratic program (QP) for a convex set, wherein constraints of the QP include a set linear equalities and a set of linear inequalities, wherein the solving uses an Alternating Direction Method of Multipliers (ADMM), wherein variables of the convex QP include a linear subspace constrained variable vector and a set constrained variable vector indicating desired behavior of the machine, comprising iterative steps:

solving, using a processor, the linear subspace constrained variable vector while keeping the set constrained variable vector fixed using an optimal step size and a Lagrangian multiplier;

solving, using the processor, the set of constrained variable vector while keeping the linear subspace constrained variable vector fixed using the optimal step size and the Lagrangian multiplier;

updating the Lagrangian multiplier;

repeating for a next iteration until either a termination condition for a feasible solution is satisfied or a termination condition for an infeasible solution is satisfied to produce a QP solution including one or combination of values of the linear subspace constrained variable vector and the set of constrained variable vector, wherein the termination condition for infeasible solution satisfies a tolerance greater than zero of a maximum of a normed change in set constrained variable vector from a current value to a value at a previous iteration, a normed change in the linear subspace constrained variable vector from a current value to a value at a previous iteration, a normed change in the Lagrange multiplier variable from a current value to a value at a previous iteration along the null space of the equality constraints and deviation from 0 of the angle between the Lagrange multiplier and the vector resulting from a difference of the linear subspace constrained variable vector and set constrained variable vector at the current value, and a difference of the linear subspace constrained variable vector and set constrained variable vector at the current value have element-wise a same sign as the Lagrange multiplier; and controlling the machine using the QP solution.

12. A method for controlling a machine by solving a convex quadratic program (QP) for a convex set, wherein constraints of the QP include a set linear equalities and a set of linear inequalities, wherein the solving uses an Alternating Direction Method of Multipliers (ADMM), wherein variables of the convex QP include a linear subspace constrained variable vector and a set constrained variable vector indicating desired behavior of the machine, comprising iterative steps:

solving, using a processor, the linear subspace constrained variable vector while keeping the set constrained variable vector fixed using an optimal step size and a Lagrangian multiplier;

solving, using the processor, the set of constrained variable vector while keeping the linear subspace constrained variable vector fixed using the optimal step size and the Lagrangian multiplier, wherein the QP is for a model predictive controller, wherein the solving comprises:

solving the QP, wherein variables include a linear subspace constrained variable vector of system states, controls, and, optionally, outputs and constrained outputs along a prediction interval, and a set constrained auxiliary variable vector of a same size as the linear subspace constrained variable vector, wherein the linear subspace constraints are equations of prediction model dynamics along the prediction interval, and the set constraints are the upper and lower bounds on the system states, controls, and, optionally, the output and the constrained outputs along the prediction interval; updating the Lagrangian multiplier;

repeating for a next iteration until either a termination condition for a feasible solution is satisfied or a termination condition for an infeasible solution is satisfied to produce a QP solution including one or combination of values of the linear subspace constrained variable vector and the set of constrained variable vector; and controlling the machine using the QP solution.

13. A method for controlling a machine by solving a convex quadratic program (QP) for a convex set, wherein constraints of the QP include a set linear equalities and a set of linear inequalities, wherein the solving uses an Alternating Direction Method of Multipliers (ADMM), wherein variables of the convex QP include a linear subspace constrained variable vector and a set constrained variable vector indicating desired behavior of the machine, comprising iterative steps:

solving, using a processor, the linear subspace constrained variable vector while keeping the set constrained variable vector fixed using an optimal step size and a Lagrangian multiplier;

solving, using the processor, the set of constrained variable vector while keeping the linear subspace constrained variable vector fixed using the optimal step size and the Lagrangian multiplier, wherein the QP is for machine learning with a support vector machine, the solving comprising:

solving the QP, wherein variables include a linear subspace constrained variable of a size of a normal vector for a hyperplane separating samples and slack variables for margin constraints wherein the linear subspace constraints are the margin constraints augmented by the slack variables, and a set constrained variable vector has a same size as the hyperplane and the slack variables, and wherein the normal vector is unconstrained, and the slack variables are constrained to be nonnegative;

updating the Lagrangian multiplier;

repeating for a next iteration until either a termination condition for a feasible solution is satisfied or a termination condition for an infeasible solution is satisfied to produce a QP solution including one or combination of values of the linear subspace constrained variable vector and the set of constrained variable vector; and controlling the machine using the QP solution.

14. A method for controlling a machine by solving a convex quadratic program (QP) for a convex set, wherein constraints of the QP include a set linear equalities and a set of linear inequalities, wherein the solving uses an Alternating Direction Method of Multipliers (ADMM), wherein variables of the convex QP include a linear subspace constrained variable vector and a set constrained variable vector indicating desired behavior of the machine, comprising iterative steps:

solving, using a processor, the linear subspace constrained variable vector while keeping the set constrained variable vector fixed using an optimal step size and a Lagrangian multiplier;

solving, using the processor, the set of constrained variable vector while keeping the linear subspace constrained variable vector fixed using the optimal step size and the Lagrangian multiplier, wherein the QP is for compressive sensing, the solving comprising:

solving, using the processor, the QP wherein variables include the linear subspace constrained variable vector of a size of a signal vector that is to be determined, wherein the linear subspace constrained variable vector includes measurements constraints, and a set constrained variable vector of the same size as the signal vector, wherein the linear subspace constrained variable vector constrains the linear subspace constrained variable by applying a shrinkage operator;

updating the Lagrangian multiplier;

repeating for a next iteration until either a termination condition for a feasible solution is satisfied or a termination condition for an infeasible solution is satisfied to produce a QP solution including one or combination of values of the linear subspace constrained variable vector and the set of constrained variable vector; and controlling the machine using the QP solution.

* * * * *